United States Patent [19]

Tallman

[11] Patent Number: 5,004,722
[45] Date of Patent: Apr. 2, 1991

[54] METHOD OF MAKING SUPERCONDUCTOR WIRES BY HOT ISOSTATIC PRESSING AFTER BENDING

[75] Inventor: Richard L. Tallman, Idaho Falls, Id.
[73] Assignee: International Superconductor Corp., Riverdale, N.Y.
[21] Appl. No.: 300,285
[22] Filed: Jan. 19, 1989
[51] Int. Cl.$^5$ .............................................. H01L 39/24
[52] U.S. Cl. ........................................ 505/1; 29/599; 264/104; 264/570; 505/705
[58] Field of Search ............... 29/402.19, 402.21, 599; 505/705, 1; 264/570, 104

[56] References Cited

U.S. PATENT DOCUMENTS

| | | | |
|---|---|---|---|
| 3,168,399 | 2/1965 | Takahashi et al. | 29/599 X |
| 3,221,393 | 12/1965 | Sapoff et al. | 29/855 X |
| 3,449,818 | 6/1969 | Lowe et al. | 29/599 X |
| 3,496,624 | 2/1970 | Kerr et al. | 29/402.21 X |
| 3,748,196 | 7/1973 | Kemeny | 29/402.21 X |
| 4,050,133 | 9/1977 | Cretella et al. | 29/402.21 X |
| 4,307,280 | 12/1981 | Ecer | 29/402.21 X |
| 4,562,332 | 12/1985 | Walter et al. | 29/402.21 X |
| 4,786,374 | 11/1988 | Worrell et al. | 264/570 X |
| 4,944,900 | 7/1990 | Willingham et al. | 264/570 X |

OTHER PUBLICATIONS

"Fabrication of 91K Superconducting Coils", Jin et al., AT and T Bell Laboratories.

Primary Examiner—Joseph M. Gorski
Attorney, Agent, or Firm—Herbert Dubno

[57] ABSTRACT

Powder or lengths of ceramic or metallic superconductor ceramic compositions are loaded into lengths of metal tubing. Mechanical reduction of filled tubing is facilitated by use of elevated temperatures and intermittent heat treatments as required. Rolling to a flattened cross section aids bending to the final device configurations and subsequent hot-isostatic-pressing. Hot-isostatic-pressing steps (1) close defects, including voids, cracks and joints and improve microstructure, and (2) join tested wire lengths to produce a superconductor length in the final configuration. Encapsulation of the superconductor is completed and assured with metal sleeves and solder or glass.

13 Claims, 3 Drawing Sheets

METHOD OF MAKING SUPERCONDUCTOR WIRES BY HOT ISOSTATIC PRESSING AFTER BENDING

BACKGROUND OF INVENTION

Superconducting ceramic compositions have been discovered only recently. Since 1973, it has been known that certain transition metal alloys showed: superconductivity as high as 23 K (−250° C.) Most of these were based on niobium metal and its alloys. Liquid helium (BP=4 K) was required to maintain the superconductive state. In December 1986, Müller and Bednorz announced the discovery (Georg Bednorz and Alex Müller, Z. Phys. B64, 189 (1986)) of a new ceramic superconducting compound based on lanthanum, barium, and copper oxides. Its critical temperature for superconductivity was close to 35 K. By the following month, the critical temperature Tc for the onset of superconductivity, was raised to nearly 80 K by C. W. Chu and co-workers. (M. K. WU, J. R. Ashburn, C. J. Tang, P. H. Hor, R. L. Meng, L. Gao, Z. J. Huang, Y. Q. Wang, and C. W. Chu, Phys. Rev. Lett. 58, 908 (1987)). This was achieved by changing the composition to yttrium barium copper oxide, approximated by the formula:

$Y_{1.0}Ba_{1.8}Cu_{3.0}O_{6.3}$.

Note that the formula is not exactly stoichiometric. It is believed that this lack of specific stoichiometry contributes most to the onset of superconductivity. Nevertheless, the exact mechanisms connecting superconductivity with chemical composition and stoichiometry remain unknown, even though they are receiving intensive study at this time. The most recent superconducting ceramic compositions announced to date include:
Bismuth Strontium (Calcium) Copper Oxide:

$Bi_2Sr_{3-x}Ca_xCu_2O_{8+y}$ $T_c = 114$ K.
Thallium Barium Calcium Copper Oxide:

Tl $Ba_2Ca$ $Cu_2O_7$

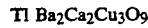

Tl $Ba_2Ca_2Cu_3O_9$

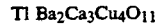

Tl $Ba_2Ca_3Cu_4O_{11}$

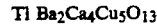

Tl $Ba_2Ca_4Cu_5O_{13}$ $T_c = 120$ K.

Superconducting ceramic compositions are normally prepared by weighing out specific quantities of selected oxides. The combination is thoroughly mixed by conventional means and then fired at elevated temperatures above about 950° C. The induced solid state reaction causes the formation of the desired ceramic composition and structure. Further annealing in an oxygen atmosphere has been shown to improve the superconducting properties of the Y-Ba-Cu-0 compound. The powder so-produced is then processed by conventional means (by compacting) to form a bar which is then used as the superconducting medium.

In other methods, one can prepare superconducting thin films by the use of the electron-beam evaporation method or the vapor phase epitaxial growth method. In the former method, appropriate oxide targets are heated to the point where they evaporate and condense on a suitable substrate. Usually, one sequentially evaporates at least three different oxides, thereby forming the desired stoichiometry and composition. For example, to obtain $Y_{1.0}Ba_{1.8}Cu_{3.0}O_{6.3}$, one evaporates copper oxide first, then barium oxide and finally yttrium oxide (which melts at 2400° C.). The desired stoichiometry is obtained by controlling the thicknesses of the layers, relative to one another. Actually, the desired stoichiometry of the superconductor (for this composition) is better approximated by:

$Y_{1.0}Ba_{1.8}Cu_{3.0}O_{7.0-x}$

One reason for this lies in the fact that once the three oxides have been evaporated onto a substrate, it is nearly always necessary to anneal the reacted composition in an oxygen-containing atmosphere to attain the superconducting state. As the second layer (barium oxide) is evaporated onto the copper oxide layer, it is still hot enough to react directly with the original layer to form (presumably) $Ba_2Cu_3O_5$. This barium cuprate compound is further reacted with the hot evaporated yttrium oxide to form the final composition. Because the evaporation temperature of $Y_2O_3$ exceeds 3400° C., the final product is likely to be deficient in oxygen because of the tendency of such oxides to form lower valence states, i.e.—$2CuO—Cu_2O+Cu$ (or $Y_2O_3—Y_2O_{3-x}$), at high temperatures, as is known in the art. This mandates a reannealing step in oxygen atmosphere to restore the critical oxide stoichiometry required for superconductivity. If the mixed oxides are calcined together, the solid state reaction temperature is almost always lower than 1500° C. If the superconductor is to be formed on a lower-melting substrate such as Si (silicon), it has been found to be necessary to evaporate a non-reactive and thermally non-conducting layer such as zirconia ($ZrO_2$) on the Si surface before one begins to form the superconductor composition.

To control stoichiometry, one controls the thickness of the individual, and sequential, layers evaporated. In one example, a 0.4 micron layer of $ZrO_2$ was formed as a protective layer. Then a copper oxide layer was deposited; a barium oxide layer was formed, followed by an yttrium oxide layer. This was repeated six times to build up an 18 layer "stack", having a thickness of about 0.75 microns. The stack was then calcined at about 950° C. in oxygen atmosphere, annealed at about 550° C. and then cooled. This process can produce only thin films of a superconducting composition.

In the vapor phase epitaxial growth method, the methodology is similar except that the targets are not vaporized but are sublimed by bombarding the surface with an electrical discharge in an inert ionized gas. For the most part, one may use halide target compositions such as $CuCl_2$, $BaCl_2$ and $YCl_3$ for sublimation sources. Ionized gas molecules such as argon or krypton bombard the target surface and cause metal chloride molecules to be redeposited onto a cooler surface. By proper control of the gaseous discharge conditions, one can cause a single crystal film of oxidic composition to build up in an epitaxial manner. That is, the growth of the superconductor becomes oriented two-dimensionally by the crystal structure of the substrate. For the most part, oxides are not used at all, but are formed during the deposition process because the whole methodology is carried out in an atmosphere containing specified quantities of oxygen gas.

The mechanism of superconductivity in such oxide-based ceramic materials is not at all well understood. The first published suggestion concerning superconductivity was made by Ogg in 1946. He proposed that superconductivity arose in quenched metal-ammonia solutions because of mobile electron pairs. The concept accepted at present is similar and is due to Bardeen, Cooper and Schrieffer (the BCS theory). It suggests that a mobile electron propagating throughout a lattice structure interacts with the bound electrons of the lattice through differences in the electron quantum spin number. If two such electrons form a pair which are bound through opposite spin-pairing (Cooper pairs), then no quantum interaction of the bound pairs can occur with the electrons of the lattice (which still have an electron moment). That the BCS theory has some validity is shown by the following example concerning the structure of the semiconductor—$YBa_2Cu_3O_6$ as compared to that of the superconductor—$YBa_2Cu_3O_7$. Both of these compounds have the idealized cubic perovskite structure. The 1:2:3 perovskite should have nine (9) oxygen atoms in the unit cell whereas the superconductor has less than seven (7). Thus, about one quarter of the oxygen atoms are missing in the superconductor. Yet, the exact mechanism of superconductivity cannot be directly related to this experimental observation.

Another method for preparing superconductors in useful form has been to form the oxides and then compact the so-produced powder into the bar. The bar was then heated on a pedestal by a LASER until it melted, a seed crystal was added, and a fiber was drawn at a controlled rate. The prototype wire was able to carry 30,000 A/cm$^2$ at 4 K. before it failed. The composition used, $Bi_2Sr_{3-x}Ca_xCu_2O_{8+y}$, was sintered, then reground and sintered again at least two more times, to achieve a uniform composition. The fiber so-produced was a single crystal but was subject to the shortcomings of all ceramic fibers, namely lack of flexibility and ductility.

All of the above methods given above for producing superconducting compositions are limited in the physical form of the superconductor that they are able to produce. For example, the superconducting powder can be compacted into only rather small pellets or rods. Many devices, especially electromagnetic windings, using superconductors require long wires or ribbons, especially electromagnet windings. As superconductors, especially ceramic superconductors, lack the ductility required for drawing into wires, special manufacturing techniques are required to provide said wires. The limitations on plastic deformation also limits the bending of superconductor wires into the configurations required in the devices.

The superconductivity property is restricted to the individual crystals of the superconductor, and is commonly highly anisotropic in each crystal. Consequently, the orientation of the crystallites is a factor affecting current-carrying capacity. A non-superconducting phase in the current-carrying paths between the crystallites would add resistance that could greatly decrease current-carrying capacity. However, intergranular phases give strength to many ceramics. Superconductors, on the other hand, are likely to suffer losses in superconducting performance from the presence of secondary phases. Many of the common techniques which might be applied to the manufacture of superconducting wires require the presence of binders or other additives which would produce voids or intergranular phases. Some impurities such as water or organic solvents and binders, must be carefully removed to limit formation of voids and shrinkage cracks. Essentially no current is carried through voids or across cracks.

Because of the adverse effects of impurity phases and impurity-caused defects upon superconductor properties, a conceptually ideal technique might use a pure superconductor as starting material and not contaminate it with impurities while producing the final wire configuration of theoretically dense superconductor. I have found that available technologies for the manufacture of metal wires and tubes, and for hot-isostatic-pressing of ceramics to close voids and cracks and to join lengths of ceramics, can be applied to the manufacture of superconducting wires in bent configurations required for devices. These wires are contained in composite structures which are comprised essentially and most simply of the superconductor wire as a core tightly contained in a generally thick-walled metal tube.

OBJECTS OF THE INVENTION

It is the central object of this invention to provide the essential components of a manufacturing process including means for making and bending composite wires and assuring that the wires have superior superconducting performance.

Available technology provides for the drawing of a wide variety of metals into wires and tubing. It is therefore an object of this invention to enable the application of available technology to successful reduction of composite wire structures to produce long wires in useful diameters.

SUMMARY OF THE INVENTION

The tubing reduction of this invention first performs the necessary compaction of the superconductor to near theoretical density. The shearing effects of this reduction on the superconductor crystals, especially the commonly highly anisotropic and layer-structured ceramic superconductor crystals, together with the further shearing effect of the subsequent reduction on the superconductor core, results in the development of a wire texture, or preferred orientation of the superconductor crystals. The current-carrying layers are oriented parallel to the wire length, thereby increasing the current-carrying capacity significantly.

These composite wires, because they have the strength and flexibility of the metal tubes, can be bent to useful configurations. This bending, however, necessarily introduces cracks into the brittle superconductor, whether metal or ceramic, thereby decreasing current-carrying capacity. However, hot-isostatic-pressing technology is known to be adequate for the healing of flaws in ceramics in general, and is therefore suited to the closing of defects in the relatively soft and less refractory ceramic superconductors. Furthermore, the encapsulation required for hot isostatic pressing is readily provided by leak-tight closing of the ends of the tubing, so as to prevent any leakage of the gas used in the process into or onto the superconductor core.

Hot-isostatic-pressing technology for joining ceramics is well known, especially as hot-isostatic-pressing was initially developed for joining and has been applied to the joining of both ceramics and metals. The joining of lengths of the composite superconductor wires requires the completion of the encapsulation of the superconductor wire core provided by the metal tubing. This is accomplished by a sleeve covering and sealed to the butted ends at each joint.

In general, the attainment and preservation of the superconducting state in ceramic superconductor compositions requires control of the oxygen stoichiometry. Consequently, this invention provides means for assuring that the core wire consists of the superconducting phase in the superconducting composition.

In the method of the invention, a suitable metal tubing is first selected, generally with a liner of a metal compatible with the superconductor, for example a copper tube with thin-walled silver tube as a liner. The tubing is loaded with superconducting powder with vibration and compaction to provide a high and uniform powder density. The tube is evacuated, backfilled with a controlled pressure of oxygen and sealed leak-tight. The tube is then reduced in diameter by a wire-drawing technique to produce a wire of the desired diameter, thereby further compacting the superconductor crystals to near theoretical density, and introducing a preferred crystal orientation favorable to superconducting current flow along the wire. The wire is then bent to the desired shape. The tube ends are closed and sealed leak-tight to provide the encapsulation required for hot isostatic pressing. Hot isostatic pressing is used to close voids and cracks in the superconductor. Alternately, the superconductor can be loaded as short rods or discs into the wire, and this tube is drawn into wire, bent to shape, and hot-isostatically-pressed. The cross section of the drawn wire can be altered before the bending step. Lengths of wire, having passed quality control tests, are joined together, either before or after bending, also using hot isostatic pressing.

DESCRIPTION OF THE PREFERRED EMBODIMENTS

The superconducting-compositions can be prepared by heating together certain oxides at elevated temperature (calcination). One weighs out defined quantities of selected oxides (or compounds which decompose at elevated temperatures to form an oxide), mixes them together by some milling procedure so that the individual oxidic particles are intimately mixed, and then calcines the mix so that the oxides undergo solid state reaction to form the desired chemical composition and stoichiometry. In many cases, it has been found to be necessary to cool the reacted mixture, regrind it and then refire it at elevated temperature. One may also sift the so-produced powder and then press it to form a desired shape such as a bar or even a pill-form. The shape is then sintered at elevated temperature so that its strength is materially improved over the unfired shape. At this point, the oxidic ceramic may have lost a small amount of oxygen from within the crystal structure and is not superconducting. Thus, it is a semiconductor, but not a superconductor. Only by proper annealing at elevated temperature (but lower than calcination and sintering temperatures) may one approach the stoichiometry of the composition required for the superconducting state by the reintroduction of the lost oxygen into the sintered piece.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
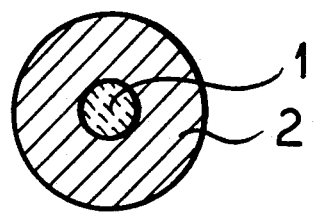
FIG. 1 is a cross-sectional view of a metal tube loaded with superconductor, ready for reduction into wire.

In FIGS. 1 through 4, throughout change lines 10–11 to the drawing, the superconductor core 1 is surrounded by a metal tube containing the superconductor core.

Figure 2:
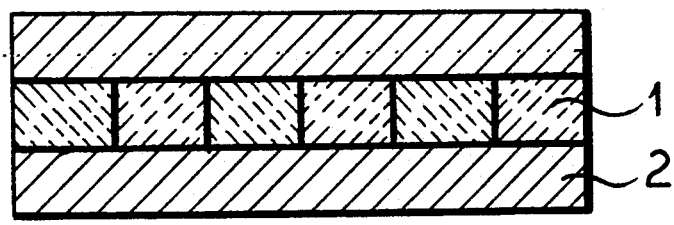
FIG. 2 is a cross-sectional view along the length of the same tube.

In FIG. 2, the superconductor 1 is illustrated as constituted of short lengths, each in the form of a right-circular cylinder. Cylinders with a wide range of aspect ratios might be used, from discs to long thin rods. A single length of rod could be used to fill a short tube.

Figure 6:
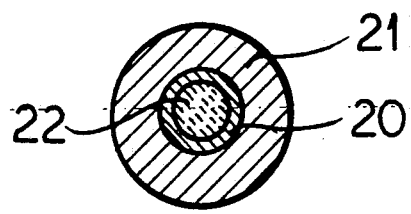
FIG. 6 is a cross-sectional view showing nested metal tubes with a superconductor core.

The difficulties and expenses associated with manufacturing and handling cylindrical shapes of super conductor are avoided by simply loading the superconductor material directly into the tube as powder (See FIG. 6). The powder is added and compacted in small amounts to improve uniformity of packing. Uniform density in the tube is provided by vibration and tamping. The superconductor powder ideally should be pure, so as to be free of impurity concentrations deleterious to performance, and uniformly of the composition known to provide the best superconducting properties. A known satisfactory procedure for preparing a superconductor powder begins with a calcination reaction, at an elevated temperature of about 900° C., of finely mixed powders or pure oxide compounds, followed by milling of the product into powder and then controlled oxidation at an intermediate temperature to produce the phase and oxidation level providing maximal superconducting properties.

Higher initial densities of superconductor cylinders for loading can be achieved by making discs, or rods of limited aspect ratio, by coldpressing or hotpressing superconductor powder. Cold isostatic pressing can be used to make longer rods. Cold isostatic pressing requires encapsulation of the powder, usually in soft elastic rubber tubing. Applicable injection molding or casting methods could also be applied. However, volatiles from solvents and binders generally required by such techniques must be removed before sealing of the metal tube for subsequent processing. Binder systems are available which are satisfactorily removable by vacuum bakeout at moderate temperatures not harmful to a ceramic superconductor.

Figure 3:
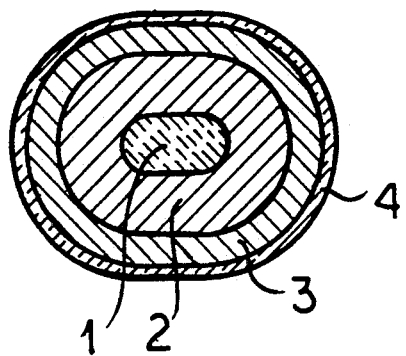
FIG. 3 is a cross-sectional view of a tube/superconductor-core wire after reduction and flattening and bending, ready for hot isostatic pressing with a sleeve on a joint and with glass or solder sealing.
Figure 4:
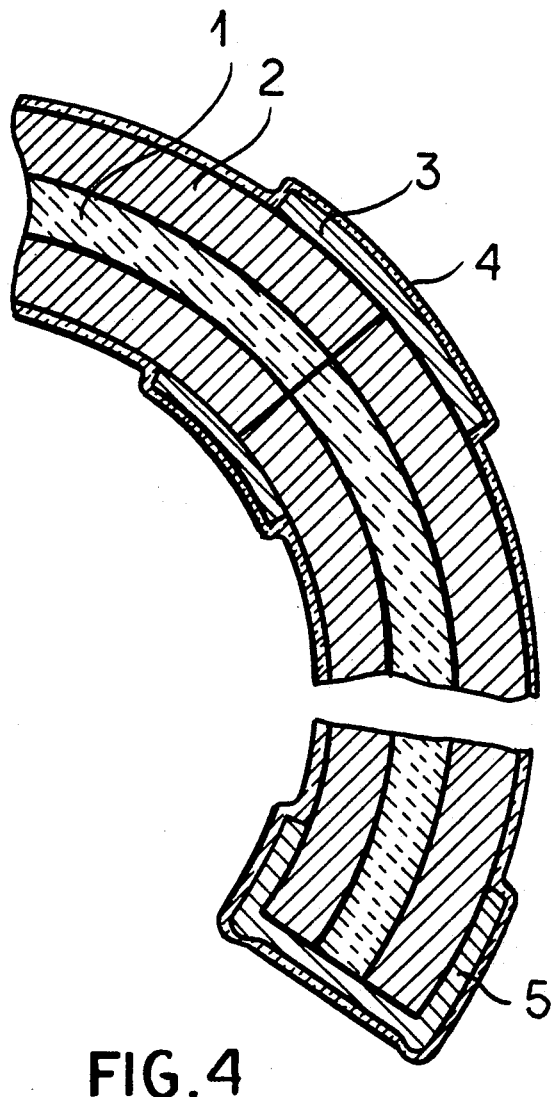
FIG. 4 is a cross-sectional view along a short length of a tube similar to that of FIG. 3, showing both a sleeve on a joint and a cap closing one end.

The tubing can be very long, and loaded with many superconductor lengths. At this extreme, the tubing provides the encapsulation for hot isostatic pressing to join the superconductor lengths. This procedure enables the manufacture of wire from a superconductor which cannot be reduced in diameter from a larger diameter satisfactorily. Referring to FIGS. 3 and 4, these cross-sectional views show the tubing/core wire after it has been reduced, then rolled and flattened and bent to the desired configuration, and readied for hot isostatic pressing by completion of the encapsulation. Only a short length of tubing and only one joint are illustrated in FIG. 4. Numeral 3 in both figures indicates the metal sleeve which holds two lengths of tubing together and facilitates encapsulation for hot isostatic pressing. Numeral 5 indicates the metal cap which closes the end tube.

In FIGS. 3 and 4, numeral 4 indicates an outer sealing layer. This sealing layer 4 is generally a brazing alloy. Glass with sufficient viscosity at the hot-isostatic-pressing temperature is a possible alternative. Wetting by the brazing alloy, or glass, of the metal tube, sleeves and end caps must occur to provide the sealing. A satisfactory match of the glass thermal expansion to that of the metal tube is also required. A perfect leak-tightness must be assured, but cannot be indicated by vacuum-leak testing because of the superconductor tightness in the tube after diameter reduction. Leakage of gas into the tube can not only produce voids in the superconductor but also can result in explosion of the encapsulating tube on depressurization in the hot-isostatic-pressing step.

An alternative to the use for encapsulation of the tubing that was used in the reduction is encapsulation of the drawn tube/core wire in another tube before bending and final hot-isostatic-pressing. In this case, standard procedures for closing the ends of the tube and for vacuum leaktesting can be applied, as the fit on the inner tube is not too tight. This alternative is like extending the sleeve length (illustrated as short in FIG. 4) to cover the whole length of the tube to provide the endcaps, and possibly to obviate the need for a sealing layer.

Electrical testing of superconductor wire lengths after hot isostatic pressing, to eliminate any length with inadequate current-carrying capacity, can be used to provide lengths which are then joined by hot isostatic pressing (with completion of the encapsulation, as required) to produce the final configuration. In the fabrication of this "tube/core" superconductor wire, the ductility and formability required for wire drawing and bending are provided by the metal tube. The metal tube must not crack or break in the reduction or bending processes, whereas the superconductor will be crushed in the drawing and cracked in the bending. The plastic deformation in the superconductor, even at elevated temperatures provided for the forming, cannot provide the ductility required to preserve integrity in the superconductor. The strength of the metal tube maintains the integrity of the wire, containing the superconductor at high density throughout the forming. The thickness of the metal tube required is greater for softer, more ductile, and correspondingly weaker metals. Forming of stronger, harder metal tubes, which can be thinner, requires higher temperatures, and also allows higher temperatures for the drawing of harder superconductors.

The metal tube protects the superconductor from contamination and from the loss of components by decomposition and evaporation, especially oxygen. However, few metals are sufficiently unreactive with oxygen for ideally satisfactory service as liners; most metals will take up oxygen from the ceramic superconductors at the processing temperatures. A further consideration in this respect is that the pressures applied in wire reduction and in hot-isostatic-pressing will overcome the decomposition pressures of the superconductors. Furthermore, the superconductor will be compacted in these processes to eliminate porosity, thereby eliminating transport of oxygen away from the superconductor surfaces.

To date, only silver has been recognized to be satisfactorily compatible with ceramic superconductors. Gold, even more expensive, would also be compatible in that gold would also not be oxidized by the equilibrium oxygen pressure of the superconductor at the processing temperatures. As the superior formability is not required, only a thin layer of silver is required in the metal tube. This can be simply provided by nesting a thin-walled silver tube in the thick-walled metal tube: the nested tubes will be bonded together in the wire-drawing process: however, the outer tube metal must not react excessively with the silver, or exhibit a phase, eutectic or otherwise, melting at too low a temperature. The silver must be thick enough to limit loss of oxygen to the more active metal of the outer tube. Furthermore, the silver must be of high purity, so that oxidation of impurities in the silver is limited. Preservation and maintenance of the oxygen content of the superconductor can be further provided by pressurizing the tube with oxygen before drawing, using a pressure required to maximize the superconducting properties. This oxygen pressure must not be chosen to be so great that it creates deleterious voids. Faster drawing and greater fractional reductions in cross sections cause greater increases in local temperatures in the wire, especially in the superconductor, and consequently greater increases in the equilibrium oxygen pressure over the superconductor. Applied oxygen pressure can be used to allow more rapid processing by equalling or exceeding the equilibrium oxygen pressure, thereby preventing the decomposition.

A further advantage of this technique is the increased current-carrying capacity of the superconductor provided by the preferred orientation of crystallites in the wire texture, which results from the wire drawing. For the layer-structured ceramic superconductors, orientation of the superconducting layers parallel to the wire length is a feature of the wire texture: Reduction of the wire diameter produces shearing plastic deformation by slip on the layer planes, which orients the layers parallel to the wire axis (just as slip on the {111} planes of a face-centered cubic metal produces a wire texture with the {111} planes parallel to the wire axis). This wire texture improves the current-carrying capacity by shortening electron paths along the wire relative to paths through crystals with conducting paths at large angles to the wire length, thereby providing an effectively larger cross-section.

A further, much larger improvement results from the improvement in the orientations of current-carrying contacts between the crystals. Ideally, to achieve the maximum current-carrying capacity, each superconducting layer of each crystal must make contacts at both upstream and downstream ends with crystal surfaces carrying current through the contacts at maximum capacity. Because of the crystal structure developed by the drawing, heat treatments increasing crystallite sizes in the wire tend to grow large crystals with superconducting planes parallel or nearly parallel to the wire. Current-carrying contacts between these crystals tend to be more complete in the sense that fewer and smaller regions of crystallites are isolated by contacts carrying only low current, so that a greater volume of the superconductor carries current.

Available techniques for wire-making include extrusion, forging, swaging, rotary swaging, rolling, drawing and combinations of techniques in sequence which can be developed to be advantageous. Both wire drawing and wire bending are facilitated, according to present manufacturing practice, by the improved plastic deformation of the metal tubing at high temperatures.

The overall process for obtaining the superconducting wires in a final configuration according to this invention can be adapted to a variety of metal alloy tubes. The wire-drawing steps, in particular, require adaptation: the higher temperatures required for making wires beginning with tubes limits the use of some alloys. The temperatures of the wires must remain below the lowest temperatures at which liquids can appear in equilibrium with the system of the metal liner (usually silver) and metal alloy of the thick-walled outer tube. This consideration defines the range of metal alloys which can be considered. Considerations of cost, corrosion resistance, magnetic properties, formability, and temperature effects on the superconductor would further limit the choices.

In addition to tubes of silver or gold, tubes of pure metals or alloys can be lined with silver (or gold), filled with ceramic superconductor, and drawn into wires. Metals and alloys sufficiently compatible with silver (or gold) and formable at sufficiently low temperatures to be of interest include pure copper, pure iron, and pure nickel, and a wide variety of alloys of these metals, including alloys with chromium and with smaller amounts of other metals. These include, but are not restricted to, the following:

Y copper-nickel alloys, e.g.—Monel alloys
Y nickel-chromium alloys, e.g.—Nichrome-V
Y iron-nickel-aluminum alloys, e.g.—some Kanthal alloys
Y iron-nickel-chromium, e.g.—some stainless steels.

EXAMPLES

1. Select a superconductor powder composition to have optimal current-carrying properties. The powder should be of uniform composition and of controlled particle distribution including both fine and coarse particles so that low porosity can result from simple compaction. A 12-in. length of 1-in. pure copper tubing, with ¼ in. inside diameter, is plugged at one end with a welded-in ½ in. long, ¼ in. diameter copper plug. A close-fitting 11 in. liner tube of pure silver with a 1/16 in. tube is inserted to the copper plug.

The powder is poured in and tamped to a density of about 0.9, ¼ in. at a time to a length of 11 in. a 6 in. length of ¼ in. tubing is brazed into the end of the tubing using as the brazing filler metal AWS-ASTM BAg-1a (50% Ag, 15.5% Cu, 16.5% Zn, 18% Cd). Using this tubing, the tubing is evacuated while at a temperature of 140° C. and then backfilled with a pressure of 0.1 atm. of oxygen and the tubing is pinched closed and resistance welded to seal it at two locations. The tube is heated to 450° C. and drawn to wire about 235 ft. of wire about 1/16 in. in diameter by reductions of about 30 percent each.

This wire is rolled to a square cross-section in a Turks head mill. The required length is cut, the ends are capped, using BAg-1a brazing filler metal to provide a leak-tight brazed closure, and the wire is then wound in a tight coil for an electromagnet. The assembly is placed in a hot isostatic press, and at room temperature, the pressure of argon required to produce a pressure of 30,000 psi at 550° C. is applied, the temperature is raised to 550° C. and maintained at that temperature for ½ hour, the temperature is ramped slowly to room temperature, and then the pressure is vented.

2. The steps of Example 1. are followed through to the 1/16 in. diameter wire, which has a round cross-section. The wire, in a 2-ft. diameter coil is hot isostatically pressed according to the process in Example 1, and then tested to eliminate lengths with inadequate superconducting properties. Lengths which can be joined for use in the device to be made are cut from the lengths with adequate properties.

The wire lengths are bent to the desired configurations, leaving the ends exposed and available for joining. The ends to be joined are cut and squared to the end-lengths required. Thin, tight-fitting rings of the BAg-1a brazing filler metal are pressed on the ends of the wire lengths, which are then inserted into close-fitting sleeves, which are 1 in. lengths of thin-walled copper tubing, and the rings of filler metal are moved to the ends of the sleeves. The joints are sealed leak-tight by brazing with the BAg-1a filler metal using techniques known to the art which avoid the use of any flux which might contaminate the superconductor. This brazing must be accomplished with well-controlled minimal and localized heating of the sleeve-ends and the braze filler metal rings. The assembly is then hot-isostatically-pressed according to the procedure of Example 1.

Figure 5:
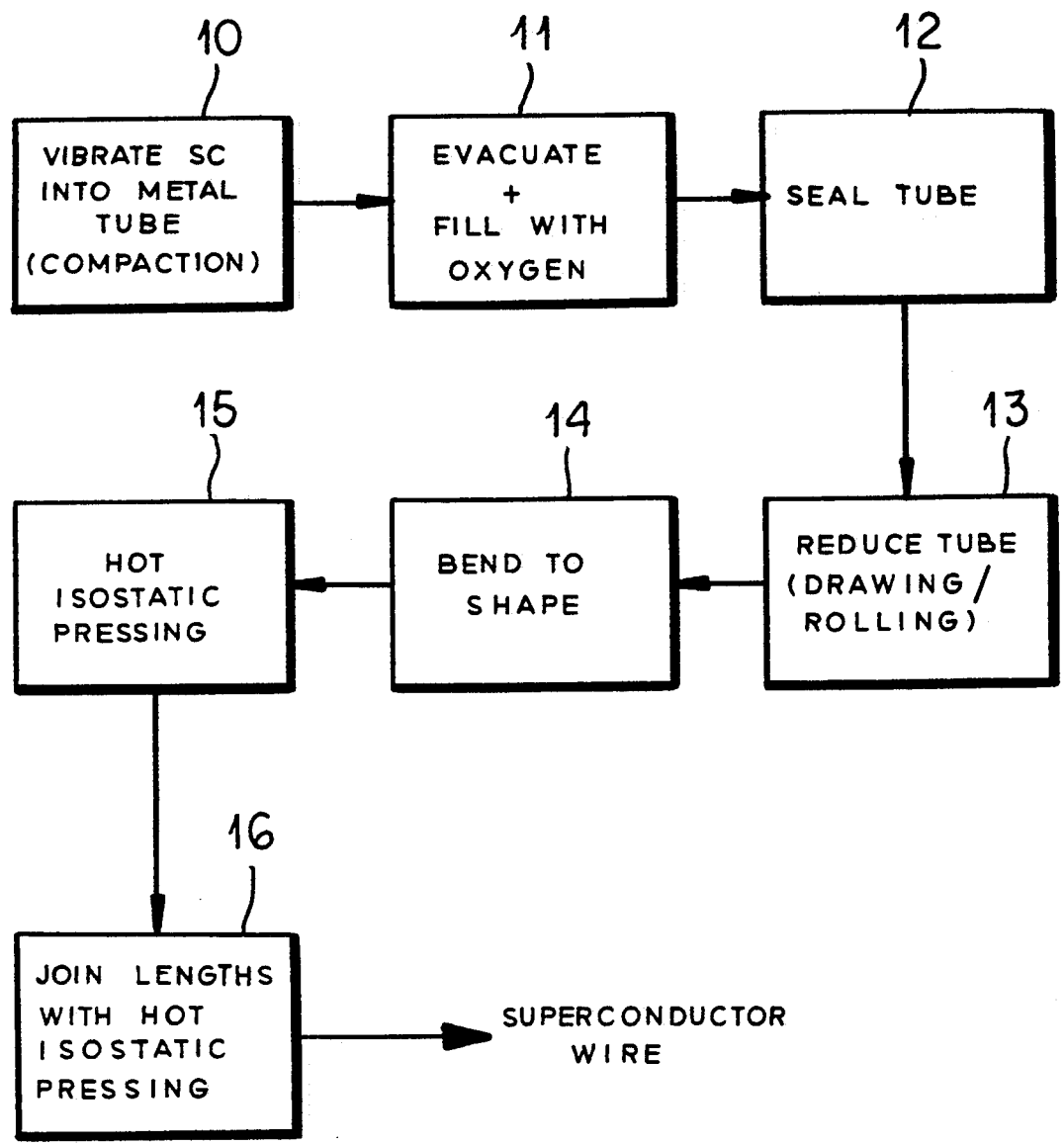
FIG. 5 is a block diagram indicating a sequence of steps used in accordance with the invention in the fabrication of a superconductor wire.

In FIG. 5 I have shown in block diagram form a sequence of steps in fabricating a superconductor wire, in accordance with the invention. In the initial step, a superconductive ceramic oxide of any of the types previously described, comminuted to form a fine powder, is vibrated into the inner silver metal tube 20 of an outer copper metal tube 21 to provide a dense core 22 of the superconductive material (see FIG. 6). This compaction stage 10 is followed by an evacuation of the interior of the metal tube which extracts air from the voids between the particles and is followed by a back-filling with oxygen at the next stage 11. Evacuation and back-filling may be repeated a number of times and vibration of the tube may be continued during this operation to ensure a minimum void volume with a void filled with pure oxygen.

The tube is then sealed at 12 and can be reduced in cross section at 13 following an annealing heating of the tube to increase the plastic deformability of the metal. The drawing and rolling operation can also flatten the tube, and is carried out at a temperature sufficient to fuse, under the reduction pressure applied, the particles of the superconductive ceramic oxide together.

The tube is then bent to shape at 14 (e.g. into a coil turn or turn segment), thereby causing the formation of cracks in the crystalline ceramic superconductor.

The cracks are then healed by subjecting the bent segment to hot isostatic pressing at 15, thereby further compacting the metal tube against the ceramic superconductive oxide core and fusing the core to eliminate the cracks and voids.

Lengths of the superconductor wire thus formed can be joined together and sealed at the joints as described in the next stage 16 and joints are subjected to hot isostatic pressure so that the metal tubing and superconductive coils at the joints are fused into unitary structures.

I claim:

1. A method of making a superconducting wire, comprising the steps of:
    (a) introducing a ceramic superconductive material into a metal tube;
    (b) evacuating ambient air from said tube after introduction of said superconductive material into said tube;
    (c) backfilling said tube with oxygen;
    (d) thereafter sealing said tube;
    (e) subjecting said tube with said material contained therein and after sealing to cross section reduction and elongation, thereby compacting said tube against said material and compacting said material within said tube;
    (f) thereafter bending said metal tube containing said superconductive material into a useful shape having at least one bend; and
    (g) thereafter hot isostatically compressing said tube and said superconductive material within said tube at a pressure and temperature and for a duration sufficient such that said tube is collapsed onto said material and voids and cracks in said superconductive material in said tube are healed.

2. The method defined in claim 1, further comprising the step of forming individual bodies of a superconductor by sintering a superconductor powder constituting said superconductive material, said individual bodies being filled into said tube in step (a).

3. The method defined in claim 1 wherein the cross section reduction in step (e) includes flattening of said tube with said material contained therein.

4. The method defined in claim 1, further comprising the step of joining individual lengths of said metal tube containing said superconductive material end to end to form said wire.

5. The method defined in claim 4 wherein said lengths are subjected to hot isostatic compression after said lengths are joined.

6. The method defined in claim 5 wherein said lengths are also subjected to hot isostatic compression before said lengths are joined.

7. The method defined in claim 4, further comprising the step of encapsulating joints formed between said lengths upon butting of ends of said lengths together by hot isostatic pressure, and hermetically sealing said joints and ends of said wire.

8. The method defined in claim 7, further comprising the step of testing said lengths for superconducting properties before joining said lengths and then joining only those of said lengths having superconducting properties following the testing.

9. The method defined in claim 8 wherein the sealing is effected by flowing a molten metal over said joints.

10. The method defined in claim 7 wherein the sealing is effected by applying a glassy layer to said joints of a material plastically deforming at the temperature of said hot isostatic compression.

11. The method defined in claim 7 wherein said cross section reduction is effected at an elevated temperature, thereby inducing shear in said material and superconductor crystals present in said material in a longitudinal dimension of the wire.

12. The method defined in claim 11, further comprising the step of annealing the tube containing said material prior to said cross section reduction, thereby enhancing ductility of said tube.

13. The method defined in claim 1 wherein said bending is carried out at an elevated temperature affording increased plastic deformability of said tube.

* * * * *